United States Patent [19]

Dydyk

[11] 4,075,578
[45] Feb. 21, 1978

[54] ACCUMULATING CAVITY MICROWAVE OSCILLATOR

[75] Inventor: Michael Dydyk, Scottsdale, Ariz.

[73] Assignee: Motorola, Inc., Schaumburg, Ill.

[21] Appl. No.: 789,463

[22] Filed: Apr. 21, 1977

[51] Int. Cl.² ............................................. H03B 7/14
[52] U.S. Cl. ..................................... 331/56; 331/101; 331/107 R
[58] Field of Search ....................... 331/46, 48, 55, 56, 331/96, 101, 102, 107 R, 107 G

[56] References Cited

U.S. PATENT DOCUMENTS

| | | | |
|---|---|---|---|
| 3,628,171 | 12/1971 | Kurokawa et al. | 331/56 |
| 3,931,587 | 1/1976 | Harp et al. | 331/56 |
| 3,984,788 | 10/1976 | Peyrat | 331/107 R |

Primary Examiner—Siegfried H. Grimm
Attorney, Agent, or Firm—M. David Shapiro

[57] ABSTRACT

An accumulating cavity microwave oscillator having a plurality of coaxial circuit mounted negative resistance diodes coupled to the cavity wherein the plurality of coaxial circuits may be mounted in concentric circles or in other symmetrical or non-symmetrical configurations and one or more coupling mechanism outputs may be utilized. No output is required to be located at the center of either the accumulator or the auxiliary cavity thereby allowing cavity tuners to be mounted there. The coupling coefficient in the coaxial circuits is equal to one plus the coupling coefficient of the output probes in order to present a relatively constant load to the diodes over the operating frequency range, thereby maximizing the usable operating frequency range.

11 Claims, 7 Drawing Figures

4,075,578

ACCUMULATING CAVITY MICROWAVE OSCILLATOR

FIELD OF THE INVENTION

The invention relates to a microwave power oscillator having a plurality of negative resistance diodes mounted in an equal number of coaxial circuits, the oscillator having at least an accumulator cavity and one or more coupling mechanism outputs mounted off the center or axis of the accumulator cavity. The coupling coefficients of the probes and the coaxial circuits are chosen to present a nearly constant load to the diodes over the operational frequency range.

BACKGROUND OF THE INVENTION

Microwave oscillators utilizing accumulating cavities are the subjects of the Kurokawa et al U.S. Pat. No. 3,628,171 and the Harp et al U.S. Pat. No. 3,931,587. My copending application Ser. No. 699,722 filed June 24, 1976 and now U.S. Pat. No. 4,034,314, teaches the use of auxiliary cavities for providing more stable operation and lower losses in such apparatus. The state of the prior art limits the output power of such devices due to the limited space available at the periphery of the accumulation cavity for mounting and coupling coaxial circuit mounted negative resistance diode oscillators. Further, the oscillators of the prior art utilize the center of the accumulator cavity for placement of a capacitively coupled output probe, thereby precluding this space from use for a tuning device or a coaxial circuit mounted diode or other active element.

A further encroachment on the available space which may be utilized for diode circuits is the space limiting effect of tuning devices which must extend into the accumulator side walls when the center of the cavity is pierced by an output probe. When sidewall tuning mechanisms are used, the effective tuning range is limited compared to systems using axial tuning mechanisms.

Still another shortcoming in prior art apparatus is the detrimental effect of the change in coupling coefficients of both output probe and input coupling circuits as a change is made in the frequency of operation of the system. The result is limiting in terms of constant power output capability over the tuning range of the system due to variation in power output with those coupling coefficient changes.

SUMMARY OF THE INVENTION

The foregoing and other shortcomings and problems of the prior art are overcome, in accordance with the present invention by taking the output power from a coupling mechanism located away from the center of the accumulating cavity and even from a location on the perimeter of the cavity. The useful bandwidth of the oscillator is extended by selecting the ratio of cavity input to cavity output coupling coefficients so that the characteristics which change with frequency are self compensating.

Therefore, according to one aspect of the invention, more space is made available for active oscillation elements by locating the system output coupling mechanism off the axis of the accumulating cavity, thereby providing for higher power output levels.

According to another aspect of the invention, tuning devices may be located on the axis of the accumulating cavity since there may be no active element or output coupling mechanism located there, thereby providing for a wider frequency tuning range.

According to still another aspect of the invention, more flexibility is availble in the selection of the coupling coefficient between input and output ports and the accumulation cavity.

According to yet another aspect of the invention, the relationship between the accumulation cavity inputs and outputs are selected to provide automatic frequency compensation to allow a broader frequency band of operation.

These and other advantages of the invention will become more readily understood upon reading the detailed description which follows together with the drawings in which.

DETAILED DESCRIPTION OF THE INVENTION

Figure 1:
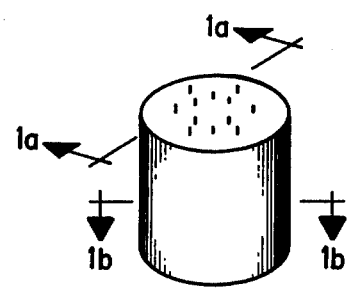
FIG. 1 illustrates an overall view of the oscillator of the invention.
Figure 1B:
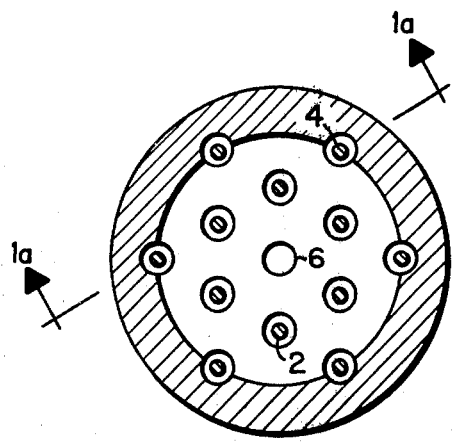
FIG. 1b illustrates a typical horizontal cross section through the accumulator cavity of the oscillator of FIG. 1.
Figure 1A:
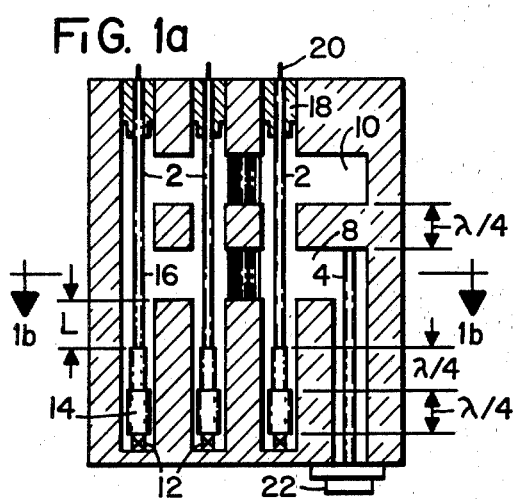
FIG. 1a illustrates in vertical cross section the preferred embodiment of the oscillator of FIG. 1.

FIG. 1a is a cross sectional view, as shown in FIG. 1 at A—A, of a preferred embodiment of the invention. FIG. 1b is a cross section of FIG. 1a at section B—B. FIG. 1b illustrates an embodiment of the invention that utilizes 11 coaxial lines 2 and one output line 4. Center position 6 may be utilized for tuning devices (not shown) in cavities 8 and 10. Coaxial line assemblies 2 comprise diode 12, matching members 14, conductor 16 and load termination 18. Load terminating 18 may be stepped as shown or, alternately, may be of tapered construction such as is described in my copending application Ser. No. 699,722 filed June 24, 1976 and now U.S. Pat. No. 4,034,314. Coaxial conductor 16 is coupled to first cavity 8. The coupling coefficient between coaxial conductor 16 and first cavity 8 may be designated $\beta_{ix}$, where "x" designates any one of the eleven coaxial oscillator circuits and "i" indicates any one of the input coupling coefficients. It will be understood that if the particular family of coaxial circuits are symmetrically located on a concentric circle, as shown in FIG. 1, the coupling coefficients of that family will be identical. Similarly, center conductor 16 of coaxial circuit 2 is coupled to second or auxiliary cavity 10. The coupling coefficient between center conductor 16 and second cavity 10 may be designated $\beta_{2x}$. Output coupling mechanism 4 is coupled to first cavity 8. The coefficient of coupling between output coupling mechanism 4 and first cavity 8 may be designated $\beta_{oy}$, where "y" indicates which of a plurality of output coupling mechanisms to which reference is made. It is important to note that output coupling mechanism 4 is located near the perimeter of cavity 8. This position allows inductive coupling to cavity 8, as shown. Coupling coefficients $\beta$ between output coupling mechanism 4 and cavity 8, coaxial conductor 16 and cavity 8 and coaxial conductor 16 and cavity 10 may all be determined by size and placement of conductor 16 and coupling mechanism 4 in cavities 8 and 10.

Bias current for diode 12 may be supplied at contact 20 as will be well known to one skilled in the art. Output power from the device may be taken from connector 22 which is connected to coupling mechanism 4.

The preferred relationship between $\beta_i$ and $\beta_o$ is as follows:

$$\beta_i = 1 + \beta_o \tag{1}$$

Further the relationhip between $Z_o$, the characteristic impedance of coaxial line 2; $R_L$, the output impedance of connector 22 and the coupling coefficients is as follows:

$$R_L = 2Z_o\beta_i/(1 + \beta_0) \tag{2}$$

It will be clear to one skilled in the art that the configuration providing for output coupling mechanism 4 placement other than at the center of cavities 8 and 10 enables the designer to provide more than one output. The outputs may be balanced or unbalanced, that is, the coupling at each of a plurality of output mechanisms 4 with first cavity 8 may vary so that the output power from each coupling mechanism 4 is different, or the coupling coefficients may be the same, thereby providing output powers which are equal. In order to provide optimum coupling between input coaxial lines 2 and output coupling mechanisms 4 with first cavity 8 and second cavity 10, it is necessary to take into account the positioning of each of the couplings involved and to select values for $Z_o$, $R_1$, $\beta_o$, and $\beta_i$ in such a way that the requirements of equations (1) and (2) are met in each case. One skilled in the art will be well aware of the necessary design requirements.

Where coaxial oscillator circuits 2 are located on the perimeter of accumulator cavity 8, a portion of the diode mounting and locking mechanism may be located outside of a line projected parallel to the cavity axis from the perimeter wall of the cavity. This means that less of the mounting space on the parallel walls of the cavity is occupied by this mechanism and, therefore, more of that space is available for mounting coaxial oscillator circuits within the perimeter of the cylindrical accumulator cavity. This advantage also accrues where an output probe is located near the cavity wall perimeter. A significant portion of the connector coupling mechanism may then be located outside of a projection from the cavity cylinder.

Figure 2:
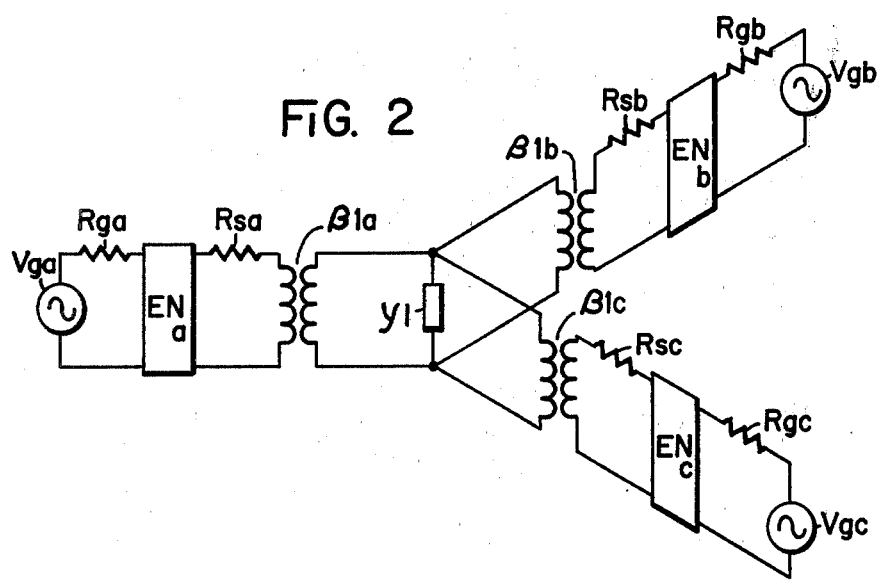
FIG. 2 is an equivalent schematic diagram of the oscillator of FIG. 1 having three active oscillating elements, where each active oscillating element is representative of a family of such elements.

In order to better understand the electrical characteristics of the device illustrated in FIGS. 1a and 1b, equivalent circuits are shown in FIGS. 2, 3, 4 and 5. FIG. 2 illustrates an equivalent electrical circuit of a device such as that shown in FIG. 1 having three input diode circuits where each of the circuits is representative of a family of circuits having identical electrical characteristics. In each case $V_g$ represents the equivalent voltage generator of a diode 12 (see FIG. 1), $R_g$ indicates the internal resistance of diode 12, EN is equivalent to equalizing network 14 and $R_s$ is as shown in more detail in FIG. 3. $\beta_i$ is the coupling coefficient with first cavity 8. $Y_1$ is the load on first cavity 8 and is shown in more detail in FIG. 4. Subscripts $a$, $b$ and $c$ are used throughout FIG. 2 to indicate those equivalent components related to each of the three representative diode circuits of the example.

Figure 3:
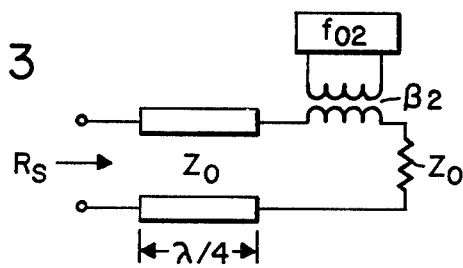
FIG. 3 is a more detailed schematic representation of the load, $R_g$, of FIG. 2.

As was previously mentioned, $R_s$ is shown in more detail in FIG. 3. It comprises $Z_o$, the characteristic impedance of coaxial line 2, load termination 18 which is equal to $Z_o$, and $\beta_2$ the coupling coefficient between line 2 and second cavity 10 which is resonant at frequency $fo_2$.

Figure 4:
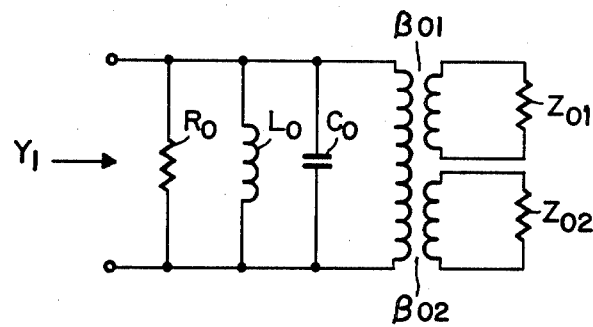
FIG. 4 is a more detailed schematic representation of the load $Y_1$ of FIG. 2.

FIG. 4 is illustrative of an equivalent circuit having a value of $Y_1$. FIG. 4 assumes two outputs such as, for example output coupling mechanism 4 as shown in FIG. 1. $\beta_{o1}$ and $\beta_{o2}$ are the respective coupling coefficients between a first and second output from first cavity 8. $Z_{01}$ and $Z_{02}$ are the characteristic impedances of a first and second output such as coupling mechanism 4 in FIG. 1. $R_o$, $L_o$ and $C_o$ are equivalent values of resistance, inductance, and capacitance of cavity 8.

Figure 5:
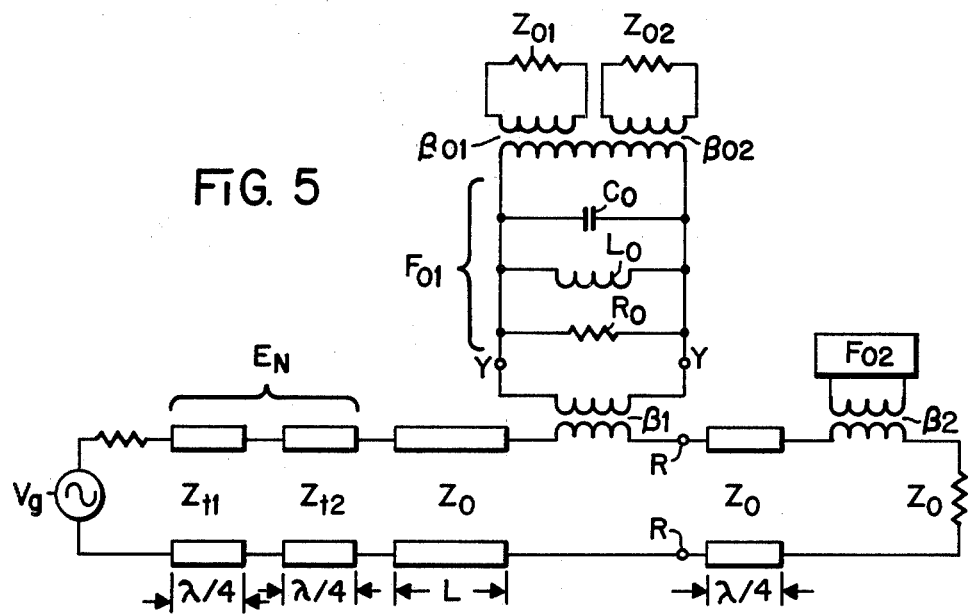
FIG. 5 is a schematic representation of an oscillator of the type shown in FIG. 1 having only one active oscillator element and two output ports.

FIG. 5 is illustrative of an equivalent circuit of a system similar to that of FIG. 1. Only one diode coaxial line 2 equivalent is illustrated in FIG. 5 and two output circuits, such as coupling mechanism 4 associated with output connector 22, are illustrated. Of course, these numbers may be expanded as desired. $V_g$ and $R_g$ are the equivalent voltage and internal resistance of a given diode such as diode 12 in FIG. 1. EN is equivalent to equalizing network 14 of FIG. 1. The design of each equalizing network (transformer) EN must be tailored to the particular coaxial circuit so that diode 12 is matched to the output impedance, taking into account the coupling coefficients, $\beta_{ix}$ and the location of the coupling with respect to cavity 8. $Z_o$ represents the characteristic impedance of line 2 as is shown in FIG. 1a. The circuit to the right of points R—R (FIG. 5) will be recognized as being the same as the circuit of FIG. 3. The circuit above points Y—Y will be recognized as being the same as the circuit of FIG. 4. $\beta_i$ is the coupling coefficient between coaxial line 2 and first cavity 8. If the reader desires to expand the circuit of FIG. 5 to include more than one diode, he may repeat the components to the left of points R—R as many times as is necessary to obtain a new equivalent circuit for the total device.

In summary, locating at least one of the output coupling mechanisms away from the axial center of cavity 8, locating coaxial oscillator circuits 2 in varying space relationship with respect to the axis of cavity 8 and/or restricting the mathematical relationship between the input and output coupling coefficients in cavity 8 to meet the limitations of equations (1) and (2), above allows at least the following advantages over prior art devices:

(1) Tuning may be accomplished axially at the center of each of cavities 8 and 10. (See FIG. 1.) This provides for a wider tuning range than alternative configurations which pierce the cavity walls at the cylinder perimeter.

(2) Where the output coupling mechanism is located at or near the cavity wall, much of the coupling mechanism may be located outside of a projection of the cylindrical cavity wall thereby freeing up additional space within the wall perimeter for additional coaxial oscillator circuits.

(3) It becomes practical to use inductive coupling between coupling mechanism 4 and cavity 8. This allows the coupling coefficient between coupling mechanism 4 and cavity 8 to be more readily adjustable to a desired value. This in turn makes it possible to provide an oscillator network which has better broadband characteristics than that available in prior art systems.

(4) Moving coupling mechanism 4 from the center axis of cavity 8 allows a plurality of output coupling mechanisms to be provided. By adjusting coupling coefficients between each of the plurality of outputs in cavity 8, a plurality of output power levels may be provided.

(5) Additional oscillator circuits 2 mounted within the perimeter of cavity 8 provides for more output power, a generally desirable condition.

(6) The controlling of the relationship between input and output coupling coefficients in cavity 8 provide for significant improvement in the operational bandwidth of the oscillator of the invention over that of prior art oscillators.

Various other modifications and changes may be made to the present invention from the principles of the invention described above without departing from the spirit and scope thereof, as encompassed in the accompanying claims.

What is claimed is:

1. In a microwave oscillator circuit including a plurality of coaxial circuits, each of the coaxial circuits having a first and a second end, a negative resistance diode being positioned at the first end of each coaxial circuit and a matched terminating load being positioned at the second end of each coaxial circuit, an output signal being coupled from each of the plurality of coaxial circuits at points intermediate the diodes and loads, the combination comprising:
   first cylindrical cavity means for accumulating power from the plurality of output signals from the plurality of coaxial circuits, said first cavity means having a resonant frequency, $f_o$ and a central axis; and
   at least one coupling means for coupling said accumulated output signal power from said first cavity means, said at least one coupling means being coupled to said first cavity means remote from said central axis of said first cavity means.

2. The microwave oscillator circuit according to claim 1 wherein each of the plurality of coaxial circuits and said first cavity means have a coupling coefficient and said at least one coupling means and said first cavity means have a coupling coefficient and said coupling coefficient of each of said coaxial circuits with said first cavity means is equal to said coupling coefficient of said coupling means with said first cavity means plus one.

3. The microwave oscillator circuit according to claim 1 wherein said at least one coupling means is inductively coupled to said first cavity means.

4. In a microwave oscillator circuit including a plurality of coaxial circuits, each of the coaxial circuits having a first and a second end, a negative resistance diode being positioned at the first end of each coaxial circuit and a matched terminating load being positioned at the second end of each coaxial circuit, an output signal being coupled from each of the plurality of coaxial circuits at points intermediate the diodes and loads, the combination comprising:
   first cavity means for accumulating power from the plurality of output signals from the plurality of coaxial circuits, said first cavity means having a resonant frequency, $f_o$; and
   at least one coupling means for coupling said accumulated output signal power from said first cavity means, said first cavity means and said at least one coupling means having a first coefficient of coupling, said first cavity means and each of the plurality of coaxial circuit means having a second coefficient of coupling, said second coefficient of coupling being equal to said first coefficient of coupling plus one.

5. The microwave oscillator according to claim 4 wherein at least one of said at least one coupling means is inductively coupled to said first cavity means.

6. The microwave oscillator according to claim 1 further comprising:
   an unloaded second cavity means having resonant frequency, $f_o$, coupled to each of the plurality of coaxial circuits at a point an odd number of one-quarter wavelengths at frequency, $f_o$, from the first cavity means coupling points.

7. The microwave oscillator according to claim 4 further comprising:
   an unloaded second cavity means having resonant frequency, $f_o$, coupled to each of the plurality of coaxial circuits at a point an odd number of one-quarter wavelengths at frequency, $f_o$, from the first cavity means coupling points.

8. In a microwave oscillator having a plurality of coaxial circuit mounted active elements and at least one cylindrical accumulator cavity means for combining the power output from each of the plurality of active elements, each of the coaxial circuits having a characteristic impedance and there being a coefficient of coupling between each of the plurality of coaxial circuits and the accumulator cavity means, the improvement comprising:
   at least two of the plurality of the coaxial circuits being located at different distances from the axis of the cylindrical accumulator cavity means, each of said at least two coaxial circuits having an equalizing network for matching the coaxial circuit mounted active element with the output impedance of the oscillator, said equalizing network being adapted to compensate for the particular location of the associated coaxial circuit within the accumulator cavity means and each of said equalizing networks being adapted to compensate for the coefficient of coupling between the particular coaxial circuit and the accumulator cavity means.

9. The microwave oscillator according to claim 8 wherein at least one coaxial output device is coupled to the accumulator cavity means with a predetermined coupling coefficient, said predetermined coupling coefficient being equal to the coupling coefficient between the accumulator cavity means and each of the coaxial circuits minus one.

10. The microwave oscillator according to claim 9 wherein said at least one coaxial output device comprises a plurality of said output devices.

11. The microwave oscillator according to claim 8 further comprising:
   auxiliary cavity means for providing more stable operation and reduced power losses in the microwave oscillator, said auxiliary cavity means being located an odd number of quarter-wavelengths of the operating frequency from the accumulator cavity means as measured along the length of the coaxial circuits.

* * * * *